(12) United States Patent
Kumar et al.

(10) Patent No.: US 6,341,099 B1
(45) Date of Patent: Jan. 22, 2002

(54) REDUCING POWER CONSUMPTION IN A DATA STORAGE DEVICE

(75) Inventors: Sudarshan Kumar, Freemont; Sadhana Madhyastha, Santa Clara; Gaurav G. Mehta, Folsom; Jiann-Cherng James Lan, San Jose, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/672,950

(22) Filed: Sep. 29, 2000

(51) Int. Cl.[7] .................................................. G11C 7/00
(52) U.S. Cl. .................. 365/227; 365/154; 365/230.05
(58) Field of Search ................................ 365/226, 227, 365/154, 156, 189.04, 230.05

(56) References Cited

U.S. PATENT DOCUMENTS

| | | | | |
|---|---|---|---|---|
| 5,043,945 A | * | 8/1991 | Bader | 365/190 |
| 5,515,326 A | * | 5/1996 | Hirose et al. | 365/189.11 |
| 5,590,087 A | | 12/1996 | Chung et al. | 365/230.05 |
| 5,777,935 A | * | 7/1998 | Pantelakis et al. | 365/203 |
| 5,806,084 A | * | 9/1998 | Lin et al. | 711/110 |

\* cited by examiner

*Primary Examiner*—Son Mai
(74) *Attorney, Agent, or Firm*—Antonelli, Terry, Stout & Kraus, LLP

(57) ABSTRACT

A technique for reducing power consumption in a data storage device consisting of a number of data cells includes arranging the number of data cells in clusters, each cluster having more than one data cell having their data enable inputs connected together. A data write bus is provided to provide data enable signals to the data enable inputs of the number of data cells. A number of pass gates are respectively disposed between the clusters and the write data bus. The pass gates are selectively enabled to allow data enable signals to pass from the write data bus to the data enable inputs of the more than one data cell of a selected one or more of the clusters. A number of inverters may be respectively disposed between the number of pass gates and the clusters. A number of sustainer circuits may be respectively connected to the number of pass gates. Each of the pass gates may include a pair of field effect transistors which may be complementary field effect transistors. Each of the sustainer circuits may include a pair of back-to-back inverters.

15 Claims, 1 Drawing Sheet

REDUCING POWER CONSUMPTION IN A DATA STORAGE DEVICE

BACKGROUND OF THE INVENTION

1. Field of the Invention

The present invention relates to a data storage device and more particularly, the present invention relates to reducing power consumption in a data storage device by utilizing data multiplexing.

2. Description of the Related Art

Multi-ported register files are data storage devices which are commonly being used in processors. More particularly, multi-ported register files are commonly being used for temporary high-speed data storage and are disposed on the same integrated circuit chip as its associated processor.

In view of the fact that multi-ported register files are faster and simpler to implement than either a shared memory access across a data bus or a local memory for each functional unit, multi-ported register files are being preferentially used for on-chip temporary high-speed data storage.

As the performance of processors increases, the number of multi-ported register files correspondingly increases. Since register files and memory consume a relatively large percentage of the total power used by a processor, the increased size and number of register files and memory causes the percentage of power consumption thereof to also rise.

The increasing power consumption of processors has become a major concern in that power related costs, such as cooling and power delivery, are increasing, thereby increasing processor costs. In addition, high power consumption and junction temperature limit the performance of high-end processors.

Accordingly, there is a need for techniques for reducing register file power consumption.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein.

DETAILED DESCRIPTION

Figure 1:
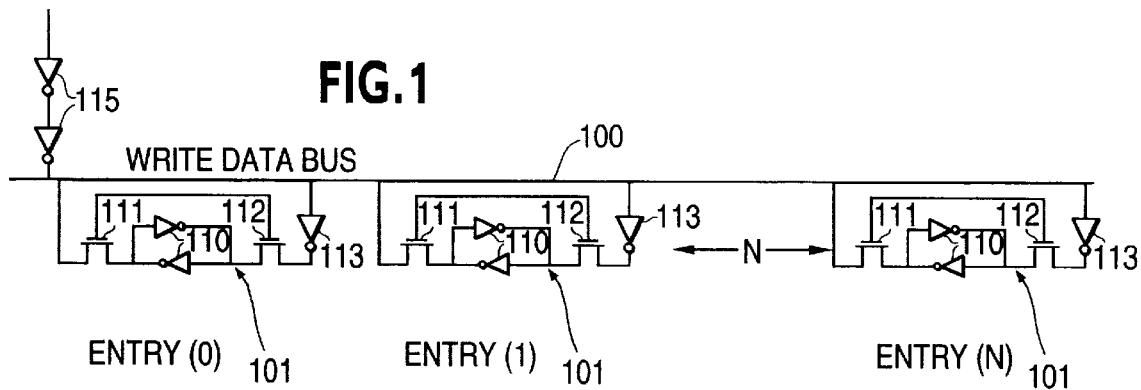
FIG. 1 illustrates the structure of a non-advantageous example arrangement of a register file bitslice structure.

Before beginning a detailed description of the subject invention, mention of the following is in order. When appropriate, like reference numerals and characters may be used to designate identical, corresponding, or similar components in differing drawing figures. Furthermore, in the detailed description to follow, example sizes/models/values/ranges may be given, although the present invention is not limited thereto. In addition, well-known power connections and other components have been omitted from the drawing figures for simplicity of illustration and discussion and so as not to obscure the invention.

FIG. 1 illustrates the structure of a non-advantageous example arrangement of a register file bitslice structure. Note that just the write data bus 100 is shown in the drawing. The corresponding read data bus has been omitted from the drawing for the sake of simplicity.

As shown in FIG. 1, there are N cells 101, labeled Entry (0), Entry (1), . . . Entry (N). Each cell 101 is composed of back-to-back inverters 110, transistors 111 and 112, and inverter 113. Each cell 101 stores one bit of data and is connected to the write data bus 100 to enable writing of data into the cell 101. A pair of inverters 115 is used to drive the write data bus 100. For an N entry register file, there are N register file cells 101 per bitslice. Typically, the cells 101 are arranged in a row in the X direction, as shown in FIG. 1, so that the number of entries determines the width (or X-dimension) of each bank or register file. The write data bus 100 is connected to the data input of all of the cells 101 in the X direction as shown in FIG. 1. Depending on the write implementation, the write data bus 100 may have one p and one n diffusion or one n diffusion and an inverter gate load, etc.

Since the data inputs of all of the cells 101 are connected to the write data bus 100 in the structure shown in FIG. 1, the capacitance loading on the write data bus 100 is relatively high. In addition, a considerable amount of power is required to enable all of the cells 101 simultaneously in the structure illustrated in FIG. 1.

Figure 2:
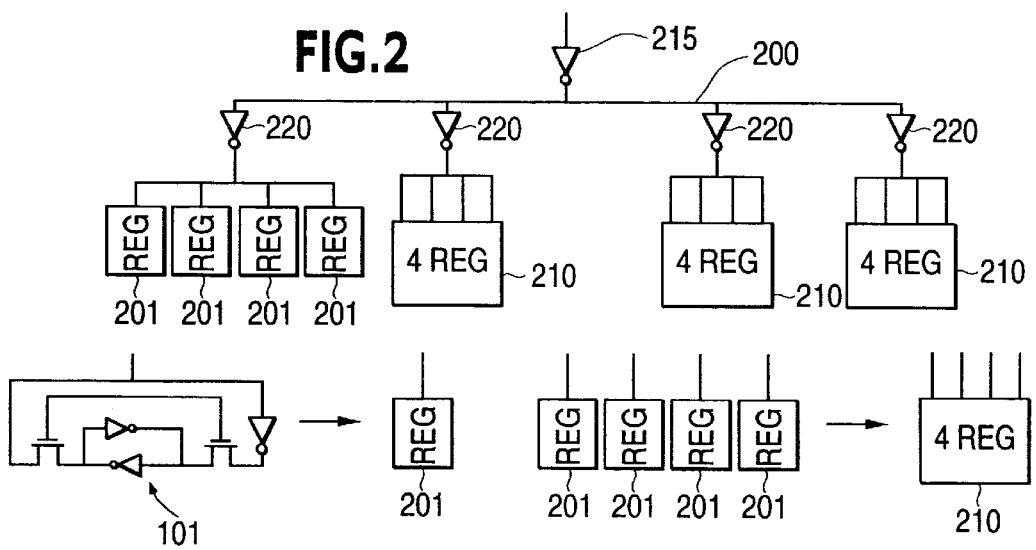
FIG. 2 illustrates the structure of another non-advantageous exams arrangement of a register file bitslice structure having a segmented write data line.

In view of the above, for larger register files having a large number of entries, the write data bus 100 is segmented into clusters of 4 or 8 cells in the bitslice and each cluster 210 is driven by an inverter 220 as shown in FIG. 2.

As shown in FIG. 2, each cell 101 is represented by register 201 and each group of 4 registers 201 is represented by cluster 210. The write data bus 200 is driven by the inverter 215 and the write data bus 200 in turn drives inverters 220 which drive the clusters 210. By segmenting the write data bus, the capacitive loading on the data bus is reduced. However, the same amount of power as the structure of FIG. 1 is required to enable all of the cells 201 and clusters 210 in the structure illustrated in FIG. 2.

Figure 3:
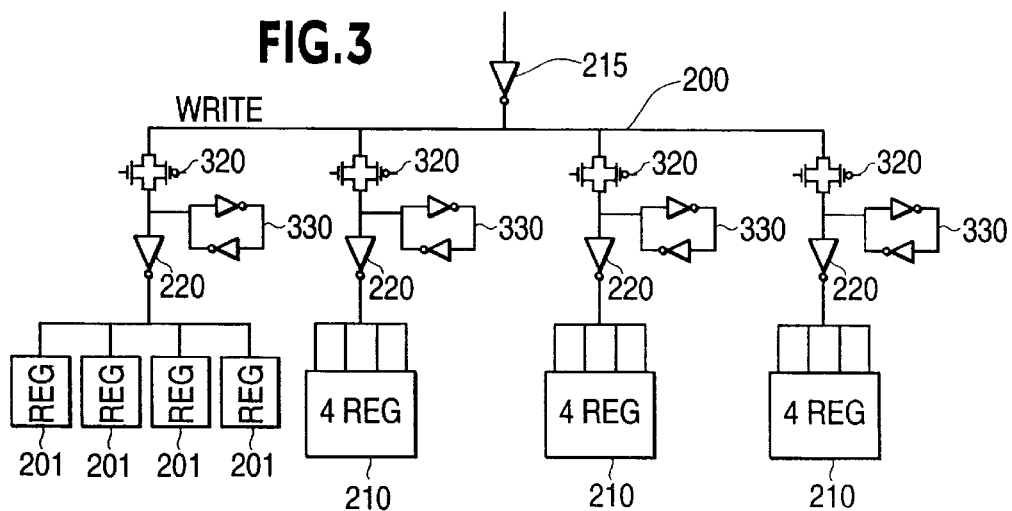
FIG. 3 illustrates the structure of an example arrangement of a register file bitslice structure in accordance with the present invention.

Accordingly, a novel write data multiplexing scheme in accordance with the present invention has been proposed to reduce the power requirements of the structures illustrated in FIGS. 1 and 2. As shown in FIG. 3, the inverters 220 driving each group of registers 201 or clusters 210 are not directly connected to the write data bus 200 but rather are connected via pass gates 320. This provides the flexibility of choosing the segment containing the cell where data is to be written while allowing all of the other segments to be disabled, thereby reducing the power requirements. That is, if the leftmost register 201 of the structure of FIG. 3 must be written into, then the leftmost pass gate 320 is enabled while the other pass gates 320 are disabled, allowing the leftmost register 201 to be written into. While the pass gates 320 have been illustrated in the drawing figure as a pair of complementary field effect transistors, it is to be understood that other circuit elements may be used to form the pass gates 320.

Element 330 shown in FIG. 3 is a sustainer circuit which is added to prevent a "floating" gate situation. That is, if a pass gate 320 is disabled, then it's corresponding inverter 220 would be floating were it not for the sustainer circuit 330 connected thereto. While the sustainer circuit 320 has been illustrated in the drawing figure as a pair of back-to-back inverters, it is to be understood that other circuit elements may be used to form the sustainer circuit.

Depending on the write implementation scheme and the segmentation of the data write bus, the power saved by the structure illustrated in FIG. 3 could be from 30 to 40 percent of the required write power.

This concludes the description of the example embodiments. Although the present invention has been described with reference to an illustrative embodiment thereof, it should be understood that numerous other modifications and embodiments may be devised by those skilled of the art that will fall within the spirit and scope of the principles of this invention. More particularly, reasonable variations and modifications are possible in the component parts and/or arrangements of the subject combination arrangement within the scope of the foregoing disclosure, the drawings, and the appended claims without departing from the spirit of the invention. For example, the pass gates have been shown as being field effect transistors. However, other devices may be used, and the present invention should not be construed as being limited to field effect transistors. In addition to variations and modifications in the component parts and/or arrangements, alternative uses will also be apparent to those skilled in the art.

What is claimed is:

1. A reduced power consumption data storage device comprising:
    a plurality of data cells arranged in clusters, each cluster comprising more than one data cell having their data enable inputs connected together;
    a write data bus to provide data enable signals to said data enable inputs of said plurality of data cells;
    a plurality of pass gates respectively disposed between said clusters and said write data bus, said pass gates being selectively enabled to allow data enable signals to pass from said write data bus to said data enable inputs of said more than one data cell of a selected one or more of said clusters and
    a plurality of sustainer circuits respectively connected to said plurality of pass gates.

2. The device of claim 1, further comprising a plurality of inverters respectively disposed between said plurality of pass gates and said clusters.

3. The device of claim 1, wherein each of said plurality of pass gates comprises a pair of field effect transistors.

4. The device of claim 3, wherein said pair of field effect transistors comprises complementary field effect transistors.

5. The device of claim 1, wherein each of said plurality of sustainer circuits comprise a pair of back-to-back inverters.

6. A method of manufacturing a reduced power consumption data storage device, the method comprising:
    providing a plurality of data cells arranged in clusters, each cluster comprising more than one data cell having their data enable inputs connected together;
    providing a write data bus to provide data enable signals to said data enable inputs of said plurality of data cells;
    providing a plurality of pass gates respectively disposed between said clusters and said write data bus, said pass gates being selectively enabled to allow data enable signals to pass from said write data bus to said data enable inputs of said more than one data cell of a selected one or more of said clusters; and
    providing a plurality of sustainer circuits respectively connected to said plurality of pass gates.

7. The method of claim 6, further comprising providing a plurality of inverters respectively disposed between said plurality of pass gates and said clusters.

8. The method of claim 6, wherein each of said plurality of pass gates comprises a pair of field effect transistors.

9. The method of claim 8, wherein said pair of field effect transistors comprises complementary field effect transistors.

10. The method of claim 6, wherein each of said plurality of sustainer circuits comprise a pair of back-to-back inverters.

11. A method of reducing power consumption in a data storage device comprising a plurality of data cells, the method comprising:
    arranging the plurality of data cells in clusters, each cluster comprising more than one data cell having their data enable inputs connected together;
    providing a write data bus to provide data enable signals to said data enable inputs of said plurality of data cells;
    respectively disposing a plurality of pass gates between said clusters and said write data bus, said pass gates being selectively enabled to allow data enable signals to pass from said write data bus to said data enable inputs of said more than one data cell of a selected one or more of said clusters, a remainder of said data cells in other clusters failing to receive data enable signals; and
    providing a plurality of sustainer circuits respectively connected to said plurality of pass gates.

12. The method of claim 11, further comprising providing a plurality of inverters respectively disposed between said plurality of pass gates and said clusters.

13. The method of claim 11, wherein each of said plurality of pass gates comprises a pair of field effect transistors.

14. The method of claim 13, wherein said pair of field effect transistors comprises complementary field effect transistors.

15. The method of claim 11, wherein each of said plurality of sustainer circuits comprises a pair of back-to-back inverters.

* * * * *